US007700154B2

(12) United States Patent
Olson

(10) Patent No.: US 7,700,154 B2
(45) Date of Patent: Apr. 20, 2010

(54) SELECTIVE ALUMINIDE COATING PROCESS

(75) Inventor: Walter E. Olson, Vernon, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 11/284,611

(22) Filed: Nov. 22, 2005

(65) Prior Publication Data

US 2007/0116874 A1 May 24, 2007

(51) Int. Cl.
*B05D 7/22* (2006.01)
*C23C 16/06* (2006.01)

(52) U.S. Cl. .................... 427/239; 427/237; 427/248.1; 427/250; 118/715

(58) Field of Classification Search ................ 427/237, 427/239, 248.1, 250; 118/715
See application file for complete search history.

(56) References Cited

U.S. PATENT DOCUMENTS

| | | | | |
|---|---|---|---|---|
| 3,422,795 | A * | 1/1969 | Smith | 118/308 |
| 4,294,871 | A * | 10/1981 | Hieber et al. | 427/237 |
| 4,687,892 | A * | 8/1987 | Brolin et al. | 219/611 |
| 5,071,678 | A * | 12/1991 | Grybowski et al. | 427/253 |
| 5,928,725 | A * | 7/1999 | Howard et al. | 427/237 |
| 6,032,438 | A * | 3/2000 | Sanfilippo et al. | 53/432 |
| 6,039,810 | A | 3/2000 | Mantkowski et al. | |
| 6,332,926 | B1 | 12/2001 | Pfaendtner et al. | |
| 6,485,262 | B1 | 11/2002 | Heyward et al. | |
| 6,616,969 | B2 * | 9/2003 | Pfaendtner et al. | 427/237 |
| 6,929,825 | B2 * | 8/2005 | Wustman et al. | 427/250 |
| 6,986,814 | B2 * | 1/2006 | Wheat et al. | 118/726 |
| 2001/0055650 | A1 * | 12/2001 | Pfaendtner et al. | 427/255.39 |
| 2004/0151834 | A1 * | 8/2004 | Wustman et al. | 427/237 |

FOREIGN PATENT DOCUMENTS

| | | |
|---|---|---|
| EP | 1010772 | 6/2000 |
| EP | 1076111 | 2/2001 |
| EP | 1445346 | 8/2004 |
| GB | 2256876 | 12/1992 |
| JP | 4263073 A | 9/1992 |
| JP | 2000309884 A | 11/2000 |
| JP | 2003120206 A | 4/2003 |
| WO | WO 03/064718 | 8/2003 |

OTHER PUBLICATIONS

Japanese Office Action dated Apr. 21, 2009.
Chinese Office Action dated Dec. 5, 2008.

* cited by examiner

*Primary Examiner*—Frederick J Parker
*Assistant Examiner*—Cachet I Sellman
(74) *Attorney, Agent, or Firm*—Bachman & LaPointe, P.C.

(57) ABSTRACT

A method for coating internal surfaces of a turbine engine component comprises flowing an aluminide containing gas into passages in the turbine engine component so as to coat the internal surfaces formed by the passages, allowing the aluminide containing gas to flow through the passages and out openings in external surfaces of the turbine engine component, and flowing a volume of a gas selected from the group consisting of argon, hydrogen, and mixtures thereof over the external surfaces to minimize any build-up of an aluminide coating on the external surfaces.

10 Claims, 1 Drawing Sheet

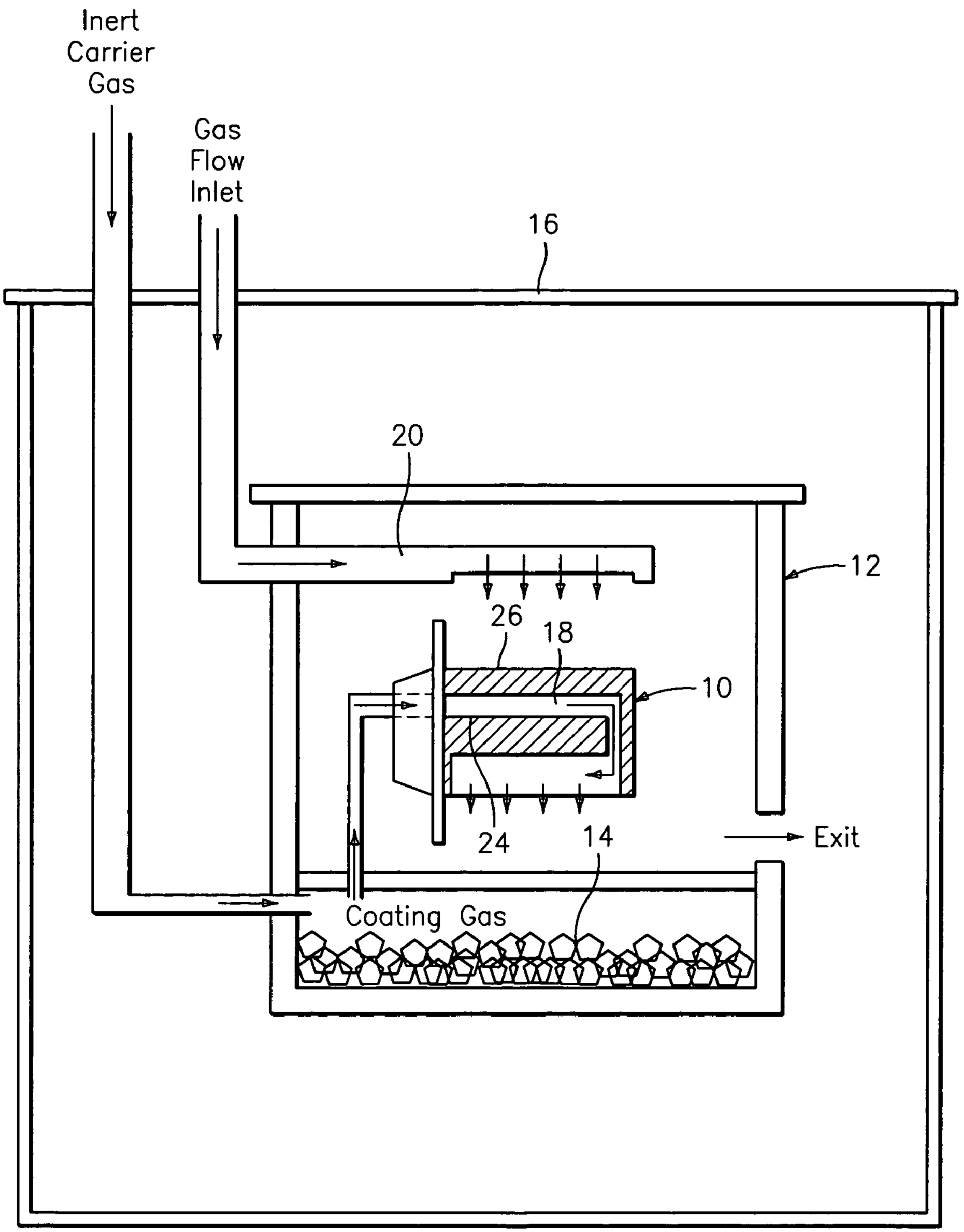
Inert
Carrier
Gas
Gas
Flow
Inlet
16
20
12
26
18
10
24
14
Exit
Coating Gas

SELECTIVE ALUMINIDE COATING PROCESS

BACKGROUND OF THE INVENTION (1) Field of the Invention

The present invention relates to a method and system for coating internal passages within a turbine engine component.

(2) Prior Art

High pressure turbine blades, vanes, and seals operating in today's gas turbine engines are life limited by both thermal fatigue cracking on the airfoil and coating defeat due to oxidation from high operating temperatures. The need for good oxidation resistance on the airfoil necessitates the application of a suitable oxidation resistance coating such as a MCrAlY metallic overlay coating with increased oxidation resistance and/or a thermal barrier coating system for temperature reduction. Internal oxidation and corrosion have been experienced in turbine engine components such as high pressure turbine blades or vanes. Thus, there is a need to coat the internal surfaces of these turbine engine components for protection from the operating environment. Vapor phase aluminizing processes in use today do not allow the coating of internal surfaces without applying a standard thickness coating on the external surface of the turbine engine component at the same time. The presence of an external aluminide with either a MCrAlY overlay or a thermal barrier coating on top is not desirable and may reduce the thermal fatigue resistance of the turbine engine component.

Current coating processes for applying a vapor aluminide coating to the internal surfaces of the turbine engine component requires a flow of an aluminum halide gas directed through the internal passages of a hollow airfoil. Complete coating coverage of all internal surfaces is a function of how well the gas flows through and contacts all surfaces on the interior of the turbine engine component. Complete internal coverage often requires all openings to the exterior of the turbine engine component, i.e. trailing edge slots, casting chaplet holes, airfoil cooling holes, tip cooling holes, etc., to remain open during the coating process. Most internally coated turbine engine components require coating coverage in these cooling features as well. Currently, there is no effective way to mask the external surfaces of a blade to prevent aluminide deposition on the external surfaces while insuring full coating coverage on all internal surfaces because of the necessity to have the openings in the turbine engine component remain open for gas flow.

SUMMARY OF THE INVENTION

Accordingly, it is desirable to provide a method and a system for coating internal surfaces of a turbine engine component without forming an exterior aluminide coating that affects thermal fatigue properties of subsequently overcoated surfaces.

In accordance with the present invention, a method for coating a turbine engine component is provided. The method broadly comprises the steps of flowing an aluminide containing gas into passages in the turbine engine component so as to coat internal surfaces formed by the passages, allowing the aluminide containing gas to flow through the passages and out openings in external surfaces of the turbine engine component, and flowing a volume of a gas selected from the group consisting of argon, hydrogen, other inert gases, and mixtures thereof over the external surfaces to minimize any build-up of an aluminide coating on the external surfaces.

Further in accordance with the present invention, a system for coating a turbine engine component is provided. The system broadly comprises means for flowing an aluminide containing gas into passages in the turbine engine component so as to coat internal surfaces formed by the passages, means for allowing the aluminide containing gas to flow through the passages and out openings in external surfaces of the turbine engine component, and means for flowing a volume of a gas selected from the group consisting of argon, hydrogen, and mixtures thereof over the external surfaces to minimize any build-up of an aluminide coating on the external surfaces.

Other details of the selective aluminide coating process and system of the present invention, as well as other objects and advantages attendant thereto, are set forth in the following detailed description and the accompanying drawing.

BRIEF DESCRIPTION OF THE DRAWINGS

The FIGURE illustrates a system for forming an aluminide coating in accordance with the present invention.

DETAILED DESCRIPTION OF THE PREFERRED EMBODIMENT(S)

Referring now to the drawing, the present invention relates to a method and a system for forming an internal aluminide coating on internal surfaces of a turbine engine component 10 while only forming an aluminide coating on external surfaces which is too thin to have any effect on the thermal fatigue properties of subsequently overcoated exterior surfaces of the turbine engine component.

To coat the internal surfaces formed by passages 18 within the turbine engine component 10 with an aluminide coating, a gas phase deposition process may be used. Any suitable gas phase deposition process known in the art may be used. For example, the turbine engine component 10 to be coated may be placed within a coating vessel 12 containing the coating material 14. In one type of gas phase process, the turbine engine component 10 being coated is suspended out of contact with the coating material 14.

The coating material 14 may be a powder mixture containing a source of aluminum, an activator, and optionally an inert buffer or diluent. The aluminum source may be pure aluminum metal or an alloy or intermetallic containing aluminum. One aluminum source which may be used is CrAl. Other aluminum sources which may be used include $Ni_3Al$, $CO_2Al_5$ and $Fe_2Al_5$. Activators which may be used include halides of alkali or alkaline earth metals. One activator which may be used is $AlF_3$. Other activators which may be used include $NH_4F.HF$ and $NH_4Cl$. A typical diluent which may be added to the powder mixture to control the aluminum activity of the mixture is $Al_2O_3$. The source material used for coating the turbine engine component may be 56% Cr-44% Al. For a coating vessel containing approximately 20 parts, the internal mix may be 700 gm of CrAl and 125 gm of AlF3). A gas, such as an inert gas, may be introduced into the vessel 12 to assist in creating a flow of an aluminum rich halide vapor.

The turbine engine component 10 and the coating material 14 while in the coating vessel 12 are placed in a furnace 16. The turbine engine component 10 and the coating material 14 may be heated to a temperature in the range of 1900 to 2100 degrees Fahrenheit, preferably from 1950 to 2000 degrees Fahrenheit, while in the furnace 16. The time at coating temperature should be sufficient to produce a coating which meets all technical requirements. Typically, the time at coating temperature is 2 hours or more.

Heating causes the activator to vaporize and react with the aluminum source to create an aluminide containing gas such as an aluminum rich halide vapor. The aluminum rich halide vapor reacts with the turbine engine component to form an aluminide coating on the internal and external surfaces 24 and 26 of the turbine engine component 10. The thickness and composition of the aluminide coating depends upon the time and temperature of the coating process, as well as the activity of the powder mixture and composition of the turbine engine component 10 being coated.

While the aluminum halide gas is being flowed into the internal passages 18 defining the internal surfaces 24 to be coated, a large volume flow of a protective gas, selected from the group consisting of hydrogen, argon, and mixtures thereof, is caused to flow over the external surfaces 26 of the turbine engine component 10. Preferably, the protective gas flows over the external surfaces 26 of the turbine engine component 10 at a flow rate in the range of from about 30 to 60 cubic feet per hour (cfh). By flowing the protective gas within this range, it is possible to sweep away any halide gas exiting from the holes (not shown) in the external surfaces 26 of the turbine engine component 10 and thus, not allow sufficient residence time on the external surface 26 of the turbine engine component 10 to develop a mature, relatively thick coating. The amount of aluminide coating deposited on the external surfaces 26 using this approach would be minimized, preferably below 0.0005 inches. An external coating this thin will have no significant effect on the thermal fatigue properties of any subsequently overcoated surfaces of the turbine engine component 10. In addition, a portion of the "thin" aluminized external surface would be removed during a subsequent grit blast operation to prepare the surface for any external coating process.

Any suitable means known 20 in the art may be used to flow the protective gas over the external surfaces of the turbine engine component 10. The flow may be directed across the airfoil portion of the turbine engine component 10 using a manifold with slots to create a laminar flow across the airfoil portion. In a production environment, one can use an upper and lower chamber set-up with a differential pressure forcing the gas to flow over the airfoil portion.

Prior to beginning the aluminide coating process, all surfaces of the turbine engine component 10 should be cleaned free of dirt, oil, grease, stains, and other foreign materials. Any suitable technique known in the art may be used to clean the surfaces.

The coating process thus described may also be enhanced by fabricating the coating vessel 12 from an inert material, such as graphite, which would not become a secondary source of aluminum during the coating process since the walls of the coating vessel would not become aluminized.

It is apparent that there has been provided in accordance with the present invention a selective aluminide coating process and system which fully satisfies the objects, means, and advantages set forth hereinbefore. While the present invention has been described in the context of specific embodiments thereof, other unforeseen alternatives, modifications, and variations will become apparent to those skilled in the art having read the foregoing description. Therefore, it is intended to embrace those alternatives, modifications, and variations as fall within the broad scope of the appended claims.

What is claimed is:

1. A method for coating a turbine engine component comprising the steps of:

providing a coating vessel consisting of a first compartment and a second compartment;

placing a turbine engine component having an airfoil portion to be coated within said first compartment;

placing means for generating an aluminum containing gas solely in said second compartment, said placing step comprising placing a powder mixture containing a source of aluminum and an activator only in said second compartment;

placing said coating vessel within a furnace;

introducing a carrier gas into said second compartment via a pipe line passing through a wall of said furnace;

heating said powder mixture and said carrier gas to cause an aluminide containing gas to flow into passages in said turbine engine component so as to coat internal surfaces formed by said passages;

allowing said aluminide containing gas to flow through said passages and out openings in external surfaces of said turbine engine component;

creating a flow of a gas selected from the group consisting of argon, hydrogen, and mixtures thereof over the external surfaces to minimize any build-up of an aluminide coating on said external surfaces while said aluminide containing gas flows out of said openings in said external surfaces, said flow creating step comprising flowing said gas through a pipeline passing through a wall of said furnace and extending through a first wall of said first compartment and flowing said gas into said first compartment at a volume in the range of from 30 to 60 cfh to maintain aluminum coating deposits on said external surfaces resulting from said aluminide containing gas flowing out of said openings in said external surfaces to a thickness less than 0.0005 inches;

maintaining said first and second compartments at different pressures so that said gas is forced to flow over said airfoil portion of said turbine engine component; and allowing both said gas and said aluminide containing gas to flow out solely through a single exit.

2. The method according to claim 1, further comprising flowing said gas over said external surfaces while said internal surfaces are being coated.

3. A method for coating a turbine engine component comprising the steps of:

providing a coating vessel consisting of a first compartment and a second compartment;

placing said turbine engine component in said first compartment which has an exit in a first wall;

flowing an aluminide containing gas from said second compartment into passages in said turbine engine component so as to coat internal surfaces formed by said passages;

allowing said aluminide containing gas to flow through said passages and out openings in external surfaces of said turbine engine component into a space defined by said first compartment;

introducing a volume of a gas selected from the group consisting of argon, hydrogen, and mixtures thereof into said space through a second wall opposed to said first wall in said first compartment and dispensing said gas so as to flow said gas onto the external surfaces of said turbine engine component while said aluminide containing gas is flowing out of said openings in said external surfaces to minimize any build-up of an aluminide coating on said external surfaces;

maintaining said first compartment and said second compartment at different pressures to force said gas to flow over said external surfaces; and exiting both said gas selected from the group consisting of argon, hydrogen, and mixtures and said aluminide containing gas from said vessel solely from said exit.

4. The method according to claim 1, wherein said aluminide containing gas flowing step comprises:

heating said composition to a coating temperature in the range of from 1900 to 2100 degrees Fahrenheit to create a flow of aluminide halide gas.

5. The method according to claim 4, further comprising maintaining said turbine engine component and said composition at said coating temperature for a time of at least 2 hours.

6. The method according to claim 4, wherein said turbine engine component placing step comprises placing said turbine engine component into said first compartment of a coating vessel formed from an inert material.

7. The method according to claim 4, wherein said turbine engine component placing step comprises placing said turbine engine component into said first compartment of a coating vessel formed from graphite.

8. The method according to claim 3, wherein said gas flowing step comprises flowing said gas at a volume in the range of from 30 to 60 cfh.

9. The method according to claim 3, wherein said dispensing step comprises dispensing said gas transverse to a longitudinal dimension of said turbine engine component.

10. The method according to claim 3, further comprising placing a composition containing a source of an aluminum and an activator into said second compartment of said vessel; placing said vessel in a furnace; and applying heat with said furnace to said composition to create said flow of aluminide containing gas.

* * * * *